(12) United States Patent
Morganelli et al.

(10) Patent No.: US 6,978,540 B2
(45) Date of Patent: Dec. 27, 2005

(54) METHOD FOR PRE-APPLIED THERMOPLASTIC REINFORCEMENT OF ELECTRONIC COMPONENTS

(75) Inventors: Paul Morganelli, Upton, MA (US); David Peard, Windham, NH (US); Jayesh Shah, Plaistow, NH (US); Douglas Katze, Sterling, MA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 259 days.

(21) Appl. No.: 10/444,867

(22) Filed: May 23, 2003

(65) Prior Publication Data

US 2004/0231152 A1   Nov. 25, 2004

(51) Int. Cl.⁷ ............................................. H05K 3/30
(52) U.S. Cl. ............................ 29/832; 29/825; 29/833; 29/840
(58) Field of Search ........................ 29/825, 832, 840, 29/833; 349/151

(56) References Cited

U.S. PATENT DOCUMENTS

| | | | |
|---|---|---|---|
| 4,643,526 A * | 2/1987 | Watanabe et al. ............ | 349/151 |
| 4,917,466 A * | 4/1990 | Nakamura et al. .......... | 349/151 |
| 5,300,459 A | 4/1994 | Ushikubo et al. | |
| 5,362,421 A | 11/1994 | Kropp et al. | |
| 5,450,283 A | 9/1995 | Lin et al. | |
| 5,510,956 A | 4/1996 | Suzuki | |
| 5,550,087 A | 8/1996 | Brossart | |
| 5,855,821 A * | 1/1999 | Chau et al. ................. | 252/514 |
| 6,020,637 A | 2/2000 | Karnezos | |
| 6,169,022 B1 | 1/2001 | Saitou | |
| 6,171,887 B1 | 1/2001 | Yamaji | |
| 6,194,788 B1 | 2/2001 | Gilleo et al. | |
| 6,297,560 B1 | 10/2001 | Capote et al. | |
| 6,399,178 B1 | 6/2002 | Chung | |
| 6,400,033 B1 | 6/2002 | Darveaux | |
| 2002/0032280 A1 | 3/2002 | Charles et al. | |
| 2002/0162679 A1 | 11/2002 | Hannan et al. | |
| 2004/0169275 A1 | 9/2004 | Danvir et al. | |

FOREIGN PATENT DOCUMENTS

| | | |
|---|---|---|
| WO | WO 00/34032 | 6/2000 |
| WO | WO 02/24391 | 3/2002 |
| WO | WO 02/080261 | 10/2002 |
| WO | WO 02/093595 | 11/2002 |
| WO | WO 2004/071140 | 8/2004 |

* cited by examiner

*Primary Examiner*—Carl J. Arbes
(74) *Attorney, Agent, or Firm*—Charles W. Almer

(57) ABSTRACT

A method for utilizing one or more pre-formed underfill compositions in the application of surface mount components, most commonly chip scale packages (CSP's), to substrates for use in electronic devices. The pre-formed underfill of the invention is applied directly to the top and/or sides of the CSP before the reflow process and softens during reflow to flow across the circuit/board gap. One underfill composition utilized for this method comprises a thermoplastic film system that provides a coating on the component that is smooth and non-tacky. The film may be applied selectively to parts of the CSP such that it overhangs the top of the component and upon reflow flows over the edge of the CSP to form a connection with the substrate. A second pre-applied underfill composition or solder paste may be applied as an adhesive to provide sufficient tack in order to hold the electronic assembly together during the assembly process and to serve as a flux to facilitate solder wetting.

12 Claims, 3 Drawing Sheets

METHOD FOR PRE-APPLIED THERMOPLASTIC REINFORCEMENT OF ELECTRONIC COMPONENTS

FIELD OF THE INVENTION

The present invention is related to a method for the use of pre-applied thermoplastic underfill to electronic devices.

BACKGROUND OF THE INVENTION

This invention relates to a method of using pre-applied thermoplastic underfill in electronic devices. The underfill is used to protect and reinforce the interconnections between electronic components and substrates in microelectronic devices. Microelectronic devices contain multiple types of electrical circuit components, mainly transistors assembled together in integrated circuit (IC) chips, but also resistors, capacitors, and other components. These electronic components are interconnected to form the circuits, and eventually are connected to and supported on a carrier or a substrate, such as a printed wire board. The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board. These chips are originally formed as a semiconductor wafer containing multiple chips. The semiconductor wafer is diced as desired into individual chips or chip packages.

Whether the component is a bare chip connected to a lead frame, or a package connected to a printed wire board or other substrate, the connections are made between electrical terminations on the electronic component and corresponding electrical terminations on the substrate. One method for making these connections uses polymeric or metallic material that is applied in bumps to the component or substrate terminals. The terminals are aligned and contacted together and the resulting assembly is heated to reflow the metallic or polymeric material and solidify the connection.

During its normal service life, the electronic assembly is subjected to cycles of elevated and lowered temperatures. Due to the differences in the coefficient of thermal expansion for the electronic component, the interconnect material, and the substrate, this thermal cycling can stress the components of the assembly and cause it to fail. To prevent the failure, the gap between the component and the substrate is commonly filled with a polymeric encapsulant, hereinafter called underfill or underfill encapsulant, to reinforce the interconnect material and to absorb some of the stress of the thermal cycling. Two prominent uses for underfill technology are for reinforcing packages known in the industry as chip scale packages (CSP), in which a chip package is attached to a substrate, and flip-chip packages in which a chip is attached by an array of interconnections to a substrate. Such arrays are commonly known as ball grid arrays (BGA). Another function of the underfill is to reinforce the component against mechanical shock such as impact or vibration. This is especially important for durability in portable electronic devices such as cellular telephones and the like that may be expected to be accidentally dropped or otherwise stressed during use.

In conventional capillary flow underfill applications, the underfill dispensing and curing takes place after the reflow of the metallic or polymeric interconnect. A drawback of capillary underfill is that its application requires several extra steps and is thus not economical for high volume manufacturing. Attempts have been made to streamline the process and increase efficiency by the use of no flow underfill and coating the no flow underfill directly on the assembly site before the placement of the component on that site. One limitation of the no flow underfill process is that the substrate and components must be pre-dried to avoid excessive voiding within the underfill that will lead to solder extrusion that ultimately may create a short-circuit to another connection. Thus, the substrates must be dried before assembly and then stored in dry storage. This process is unwieldy for high volume manufacturers. There is often great difficulty during manufacturing in uniformly applying conventional underfill materials. To avoid the inherent difficulties of underfill, pre-applied underfills have been utilized.

In order to be useful as a pre-applied underfill, the material must have several important properties. First, the material must be easy to apply uniformly so that the portion of the assembly to be coated has a consistent coating. The material must be either B-stageable, which means that it must be solidified after its placement on a CSP component to provide a smooth, non-tacky coating with minimal residual solvent, or capable of being formed into a film. To date, pre-applied underfills have been applied only to the bottom of CSP's. The limitation to applying underfill to the bottom surface is that, in most cases, the underfill must contact at least a portion of the solder bump array. This creates difficulties in creating a robust process that will not adversely affect the performance of the solder joints.

The B-stage process usually occurs at a temperature lower than about 150° C. without prematurely curing the material. The final curing of the reinforcement material must be delayed until after the solder fluxing (in the situation that solder is the interconnect material) and interconnection, which occurs at a temperature of 183° C. in the case of tin/lead eutectic solder. The final curing of the reinforcement material should occur rapidly after the solder bump flow and interconnection. During this final attachment of the individual chips to a substrate, the reinforcement material must flow in order to provide good adhesion between the chip, or chip passivation layer, the substrate, or the solder mask, and the solder joints. To date, pre-applied underfill compositions have required application to the bottom of the component, i.e. the side of the component which is to be attached directly to the electronic component.

SUMMARY OF THE INVENTION

The invention relates to a method for utilizing one or more pre-formed underfill compositions in the application of surface mount components, most commonly chip scale packages (CSP's), to substrates for use in electronic devices. The pre-formed underfill of the invention is applied directly to the top and/or sides of the CSP before the reflow process and softens during reflow to flow across the circuit/board gap. One underfill composition utilized for this method comprises a thermoplastic film system that provides a coating on the component that is smooth and non-tacky. The film may be applied selectively to parts of the CSP such that it overhangs the top of the component and upon reflow flows over the edge of the CSP to form a connection with the substrate. A second pre-applied underfill composition or solder paste may be applied as an adhesive to provide sufficient tack in order to hold the electronic assembly together during the assembly process.

DETAILED DESCRIPTION OF THE INVENTION

Figure 1:
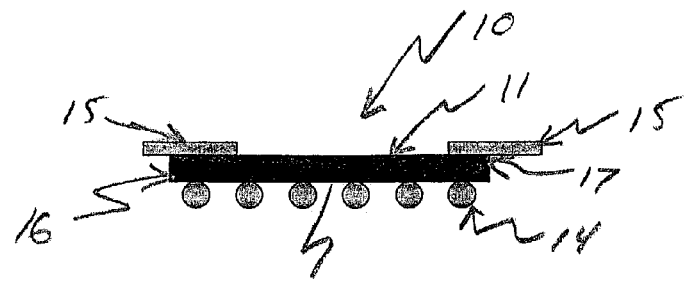
FIG. 1 is a side view of a CSP with overhanging underfill film.

The pre-applied underfill of the present invention is preferably a film that is applied directly to the top and/or sides of a surface mount component, either before or after the component is attached to a substrate. The application of the underfill in this manner allows the component manufacturer to apply the underfill and thus eliminates the need for the circuit assembler to apply underfill. The circuit assembler could also apply the underfill of the invention as an alternative to conventional underfill. The underfill material is preferably a thermoplastic film reinforcement that is applied to the top and/or sides of an electronic component such as an area array device including CSP's, BGA's or flip chips, at any point before the reflow process and overhangs or extends beyond the sides of the component. While CSP's and BGA's are used throughout the description, it is to be understood that the pre-applied underfill of the present invention may be utilized with any form of surface mount component. The bottom of the area array device is the portion of the device that is adapted to accommodate a plurality of attachment devices for attaching the device to the desired electronic component and the top is the opposite side. The overhang may be symmetrical, partially symmetrical, patterned, irregular or any other desired shape. The underfill is held in position on the component by chemical or mechanical means after application but before reflow. The thermoplastic underfill film may be a polyolefin, polyamide, polyester or polyurethane. Phenoxy resins, thermoplastic rubber, acrylics or other thermoplastics with good adhesion to the intended component(s) may also be expected to work. A second underfill material may also be utilized if desired.

The flow characteristics of the film are that it should be solid at ambient conditions and liquefy and flow across and into the gap between component and substrate during reflow. The underfill material should adhere to solder masks and absorb and dissipate mechanical energy. The underfill is applied such that it extends beyond at least a portion of one or more sides of the component and overhangs at least a portion of the component. The amount of underfill and the height to which it is applied may be varied depending upon the specific application and desired results. The application of the underfill may be accomplished via a variety of techniques including, but not limited to, direct placement on the component immediately before reflow, tape and reel, and lamination.

In one embodiment, the underfill is B-stageable, i.e., the underfill is a solid at ambient temperatures but liquefies and flows during the reflow process. The final solidification of the underfill occurs either through cooling at the end of the reflow step, in the case of thermoplastics, or by curing during the reflow step, in the case of thermosetting materials. Generally, the final cure of the composition occurs after the formation of the interconnections so as not to interfere with the alignment of the component or the formation of solder joints. Various solders, including those containing lead and lead-free may be utilized with the present invention. In the case of Pb/Sn eutectic solder, the formation of the interconnections occurs at a temperature above the melting point of the solder, which is 183° C.

Figure 2:
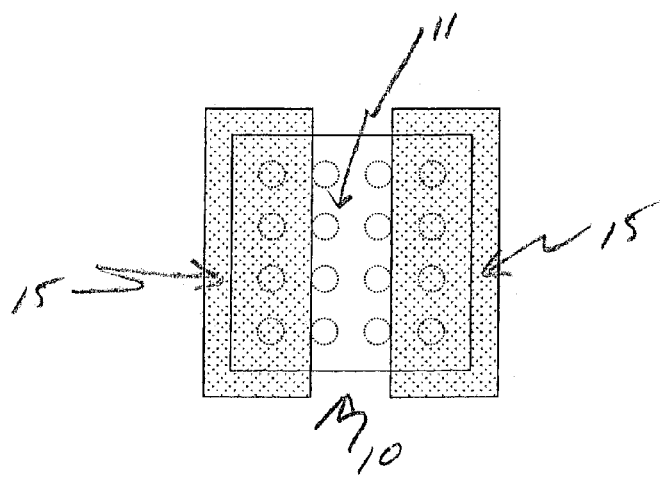
FIG. 2 is a top view of a CSP with overhanging underfill film.

FIGS. 1–8 illustrate various embodiments of the present invention. The figures are for illustration purposes only and are not intended to limit the scope of the invention. FIG. 1 illustrates a chip scale package 10 having top surface 11, bottom surface 12 and sides 16 that intersect both the top and bottom surfaces to form edges 17. For purposes of this invention, the top surface of the CSP is the surface that will not contact the substrate and is opposite the solder balls while the bottom side is the surface having the solder balls and which ultimately adjoins the substrate. Solder balls 14 may be located on the bottom surface of the CSP and facilitate attachment of the CSP to a substrate such as a printed wiring board or printed circuit. The solder balls may be an alloy of at least two metals selected from the group including tin, bismuth, nickel, cobalt, cadmium, antimony, indium, lead, silver, gallium, aluminum, germanium, silicon, gold, etc. and may be eutectic or non-eutectic. Two underfill films 15 are located on the top surface of the chip scale package and are positioned such that they overhang the edges 17 of the CSP. FIG. 2 illustrates the top view of the CSP having the overhanging underfill on two portions of the top surface. In alternative embodiments not illustrated, the underfill films overhang all or portions of one, three, four or more edges of the CSP and any number of underfill films may be utilized.

Figure 3A:
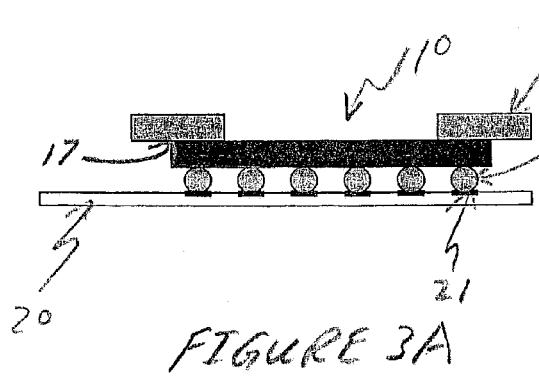
FIG. 3A is a side view of a CSP with overhanging film on a substrate before reflow.
Figure 3B:
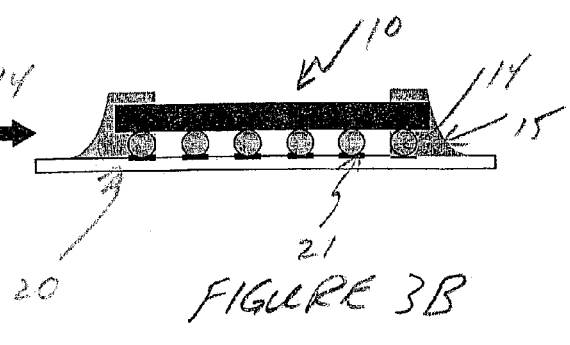
FIG. 3B is a side view of a CSP with overhanging film on a substrate after reflow.

FIGS. 3A and 3B illustrate the flow pattern of the underfill film, as applied in the form of FIG. 2, during reflow. As shown in FIG. 3A, the chip scale package 10 having pre-applied underfill 15 overhanging its top edges is affixed to the substrate 20 via solder balls 14. For illustration purposes, FIG. 3A shows the underfill overhanging two edges of the CSP, however the underfill may alternatively overhang one or more edges of the CSP. Before reflow, the pre-applied underfill is in the form of a solid film. Optionally, an adhesive or secondary underfill composition 21 may be utilized to hold the CSP in place before reflow. FIG. 3B illustrates the chip scale package and substrate after reflow. As shown in FIG. 3B, the underfill material flows down over the sides of the CSP during reflow and forms a connection between the top surface of the CSP and the substrate. At this time the unit is provided with an underfill component that is sufficient to protect the unit.

Figure 4:
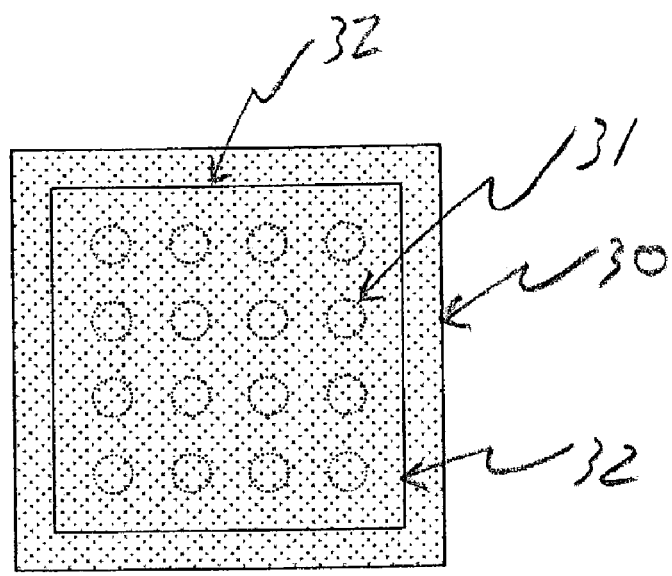
FIG. 4 is a top view of a CSP with an alternative overhanging underfill film.
Figure 5:
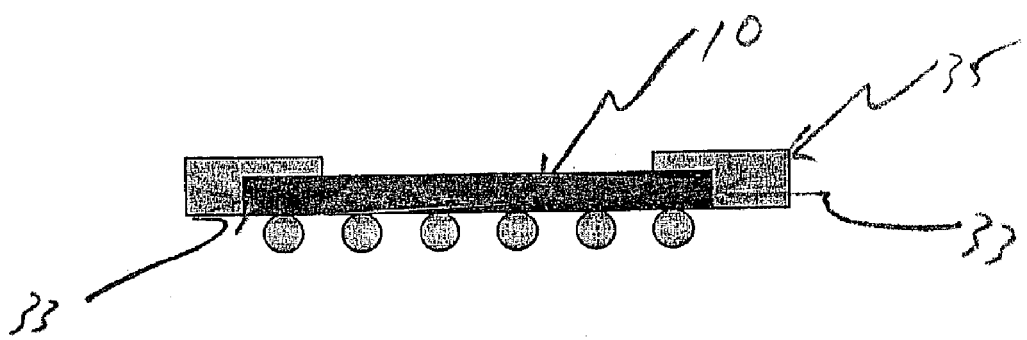
FIG. 5 is a side view of a CSP with an overhanging underfill film on its perimeter.

FIGS. 4–8 illustrate alternative embodiments of the pre-applied underfill. In the embodiment of FIG. 4, the underfill 30 overhangs all four edges 32 of the chip scale package 31. Further, the underfill is in the form of a continuous film that covers the entire top surface of the chip scale package. In this embodiment, one or more cavities (not illustrated) may optionally be positioned in the film in order to allow the escape of any moisture, solvents and/or gases during the assembly process or, in the case of a component that consumes a significant amount of power, to allow the escape of heat. FIG. 5 illustrates a further alternative embodiment in which the pre-applied underfill 35 is placed on both the top surface and sides of the CSP 10.

Figure 6:
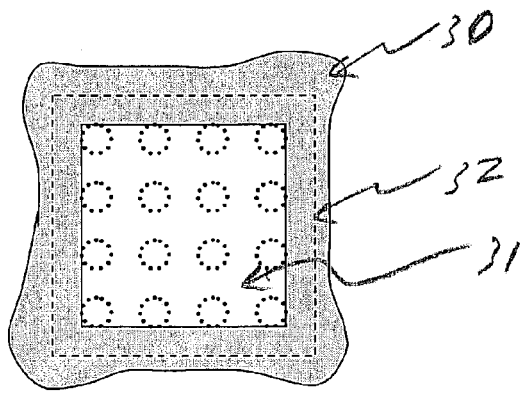
FIG. 6 is a top view of a CSP with an underfill film overhanging the perimeter of the CSP in an irregular pattern.
Figure 7:
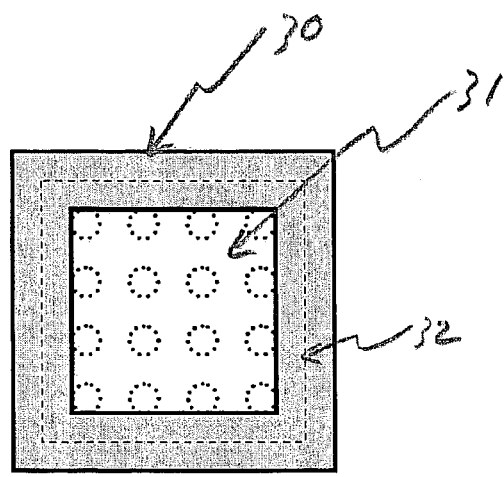
FIG. 7 is a top view of a CSP with an underfill film overhanging the entire perimeter of the CSP.
Figure 8:
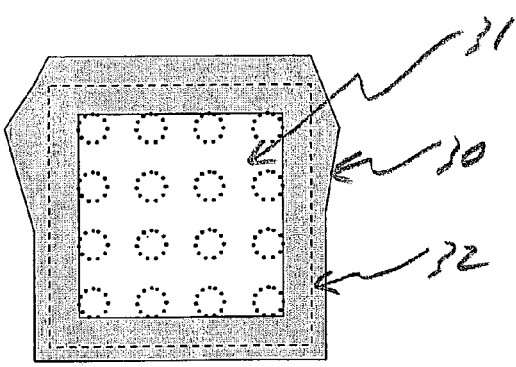
FIG. 8 is a top view of a CSP with an underfill film overhanging the perimeter of the CSP in a partially irregular pattern.

FIG. 6 shows an alternative embodiment having the underfill 30 in a pattern that overhangs the edges 32 of the CSP 31 in an irregular manner on all four edges. FIG. 7 illustrates an embodiment wherein the underfill 30 overhangs all four edges 32 of the CSP 31 but does not cover the entire CSP, thus forming a "window" pattern. FIG. 8 illustrates an embodiment having a symmetrical overhang of underfill 30 on two edges 32 of the CSP 31 and a non-symmetrical overhang on the remaining two edges of the CSP.

To utilize the pre-applied underfill of the present invention as a laminated film, the film would be pre-cast on a carrier film and then dried. Next, the film would be vacuum laminated on to the desired area of the component at the softening temperature of the system. Alternatively, the film can be pre-patterned via varying methods such as laser ablation or die cutting into different configurations such as a grid, mesh, thin strip, or square box pattern and placed or laminated onto the component. After placement, the component is subjected to reflow which causes the pre-applied underfill to flow around the sides of the CSP and into contact with the substrate. The application of the pre-applied underfill may take place at the site of the component manufacturer and will thus eliminate a manufacturing step for the assembler.

In conjunction with the pre-applied underfill, a pressure sensitive fluxing underfill composition that acts as a pressure sensitive adhesive upon application may also be pre-applied to the underside of the electronic components, such as CSP's. The composition may be applied selectively to parts of the CSP, for example to the solder bumps. The pressure sensitive adhesive property of the composition provides sufficient tack in order to hold the electronic assembly together during the assembly process and especially before the pre-applied underfill flows during the reflow step. The fluxing underfill may be applied either to the tips of the connectors, such as solder bumps, or directly to the substrate.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. A method of preparing one or more surface mount package components, comprising the steps of:
   a) providing a surface mount component having a first surface to be placed adjacent to a substrate, a second surface opposite the first surface and a plurality of sides that intersect both the first and second surfaces to form edges; and
   b) applying a planar and self-supporting thermoplastic film underfill material to at least a portion of the second surface,
   wherein the underfill material extends beyond a edge of at least a portion of the second surface of the surface mount component.

2. The method of claim 1, wherein the underfill material is applied to the entire second surface.

3. The method of claim 1, wherein the first surface contains one or more solder bumps and further comprising the step of applying an attachment material on the one or more solder bumps.

4. The method of claim 3, wherein the attachment material is a pressure sensitive fluxing underfill.

5. The method of claim 1, further comprising the step of affixing the surface mount component to a substrate to form an assembly.

6. The method of claim 1, further comprising the step of subjecting the surface mount component to heat sufficient to melt the underfill material and cause it to flow into contact with the substrate.

7. The method of claim 1, further comprising the step of applying underfill to at least a portion of one or more of the sides.

8. A method of preparing one or more surface mount package components, comprising the steps of:
   a) providing a surface mount component having a first surface to be placed adjacent to a substrate, a second surface opposite the first surface and a plurality of sides that intersect both the first and second surfaces to form edges; and
   b) applying a planar and self-supporting thermoplastic film underfill material to one or more of the sides.

9. The method of claim 8, wherein the first surface contains one or more solder bumps and further comprising the step of applying an attachment material on the one or more solder bumps.

10. The method of claim 9, wherein the attachment material is a pressure sensitive fluxing underfill.

11. The method of claim 8, further comprising the step of affixing the surface mount component to a substrate to form an assembly.

12. The method of claim 11, further comprising the step of subjecting the surface mount component to heat sufficient to melt the underfill material and cause it to flow into contact with the substrate.

* * * * *